US011011492B2

(12) United States Patent
DeAngelis

(10) Patent No.: US 11,011,492 B2
(45) Date of Patent: May 18, 2021

(54) ULTRASONIC TRANSDUCER SYSTEMS INCLUDING TUNED RESONATORS, EQUIPMENT INCLUDING SUCH SYSTEMS, AND METHODS OF PROVIDING THE SAME

(71) Applicant: Kulicke and Soffa Industries, Inc., Fort Washington, PA (US)

(72) Inventor: Dominick A. DeAngelis, Villanova, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 180 days.

(21) Appl. No.: 16/454,873

(22) Filed: Jun. 27, 2019

(65) Prior Publication Data

US 2019/0319005 A1 Oct. 17, 2019

Related U.S. Application Data

(63) Continuation of application No. 15/894,617, filed on Feb. 12, 2018, now Pat. No. 10,381,321.

(60) Provisional application No. 62/460,793, filed on Feb. 18, 2017.

(51) Int. Cl.
| | |
|---|---|
| *B23K 20/10* | (2006.01) |
| *H01L 23/00* | (2006.01) |
| *B23K 1/06* | (2006.01) |
| *B23K 1/00* | (2006.01) |
| *B23K 101/40* | (2006.01) |

(52) U.S. Cl.
CPC ............ *H01L 24/75* (2013.01); *B23K 1/0016* (2013.01); *B23K 1/06* (2013.01); *B23K 20/106* (2013.01); *H01L 24/78* (2013.01); *B23K 2101/40* (2018.08); *H01L 2224/75349* (2013.01); *H01L 2224/78301* (2013.01); *H01L 2224/78349* (2013.01); *H01L 2224/78925* (2013.01)

(58) Field of Classification Search
CPC ..................... H01L 24/75; H01L 24/78; H01L 2224/78301; H01L 2224/78349; H01L 2224/78925; H01L 2224/75349; H01L 21/67121; B23K 20/10–106; B23K 1/06; B23K 1/0016; B23K 2101/40; B29C 65/08–088
USPC ............................ 228/1.1, 110.1, 4.5, 180.5; 156/73.1–73.4
See application file for complete search history.

(56) References Cited

U.S. PATENT DOCUMENTS

| | | | |
|---|---|---|---|
| 2,891,178 A | 6/1959 | Elmore | |
| 3,054,309 A | 9/1962 | Elmore et al. | |
| 3,212,312 A | 10/1965 | Boyd et al. | |
| 3,521,348 A * | 7/1970 | Jones ...................... | B25B 21/00 29/428 |

(Continued)

FOREIGN PATENT DOCUMENTS

GB 877966 9/1961

*Primary Examiner* — Kiley S Stoner
(74) *Attorney, Agent, or Firm* — Christopher M. Spletzer, Sr.

(57) ABSTRACT

An ultrasonic transducer system is provided. The ultrasonic transducer system includes: a transducer mounting structure; a transducer, including at least one mounting flange for coupling the transducer to the transducer mounting structure; and a tuned resonator having a desired resonant frequency, the tuned resonator being integrated with at least one of the transducer mounting structure and the at least one mounting flange.

20 Claims, 21 Drawing Sheets

(56) References Cited

U.S. PATENT DOCUMENTS

| | | | |
|---|---|---|---|
| 3,614,484 A * | 10/1971 | Shoh | B24B 35/005 |
| | | | 310/325 |
| 3,813,006 A * | 5/1974 | Holze, Jr. | B23K 20/106 |
| | | | 228/1.1 |
| 4,786,356 A * | 11/1988 | Harris | B29C 66/83511 |
| | | | 156/580.1 |
| 5,364,005 A | 11/1994 | Whelan et al. | |
| 5,443,240 A | 8/1995 | Cunningham | |
| 5,469,011 A | 11/1995 | Safabakhsh | |
| 5,595,328 A | 1/1997 | Safabakhsh et al. | |
| 5,595,330 A | 1/1997 | Buice et al. | |
| 5,699,953 A | 12/1997 | Safabakhsh | |
| 5,730,832 A | 3/1998 | Sato et al. | |
| 5,772,100 A * | 6/1998 | Patrikios | B06B 3/00 |
| | | | 228/1.1 |
| 5,816,476 A | 10/1998 | Buice et al. | |
| 5,829,663 A | 11/1998 | Khelemsky et al. | |
| 5,884,834 A | 3/1999 | Vinson et al. | |
| 6,537,403 B1 * | 3/2003 | Blenke | B06B 3/00 |
| | | | 156/73.1 |
| 6,578,753 B1 | 6/2003 | Sakakura | |
| 7,137,543 B2 | 11/2006 | DeAngelis et al. | |
| 8,251,275 B2 | 8/2012 | DeAngelis et al. | |
| 8,409,383 B1 | 4/2013 | Tan et al. | |
| 9,136,240 B2 | 9/2015 | Chylak et al. | |
| 2002/0060239 A1 | 5/2002 | Or et al. | |
| 2003/0062395 A1 | 4/2003 | Li et al. | |
| 2004/0035912 A1 | 2/2004 | Li et al. | |
| 2004/0065415 A1 | 4/2004 | Sato et al. | |
| 2005/0247408 A1 * | 11/2005 | Jung | B06B 3/00 |
| | | | 156/580.1 |
| 2005/0284912 A1 | 12/2005 | Zhai et al. | |
| 2006/0022016 A1 | 2/2006 | DeAngelis et al. | |
| 2006/0144906 A1 | 7/2006 | Sheehan et al. | |
| 2006/0169739 A1 | 8/2006 | Kim et al. | |
| 2007/0199972 A1 | 8/2007 | Chong et al. | |
| 2007/0257083 A1 | 11/2007 | Narasimalu et al. | |
| 2008/0308609 A1 | 12/2008 | Felber | |
| 2009/0266869 A1 | 10/2009 | Sato et al. | |
| 2011/0036897 A1 | 2/2011 | Nakai | |
| 2011/0056267 A1 | 3/2011 | Qin et al. | |
| 2011/0220292 A1 | 9/2011 | Short | |
| 2011/0266329 A1 | 11/2011 | Hesse et al. | |
| 2012/0037687 A1 | 2/2012 | Matsumura | |
| 2012/0125977 A1 | 5/2012 | DeAngelis et al. | |
| 2012/0286023 A1 * | 11/2012 | DeAngelis | H01L 24/78 |
| | | | 228/1.1 |
| 2013/0112332 A1 | 5/2013 | Spicer et al. | |
| 2014/0034712 A1 | 2/2014 | Maeda et al. | |
| 2015/0352662 A1 | 12/2015 | Sheehan | |
| 2017/0209956 A1 | 7/2017 | DeAngelis | |
| 2018/0126483 A1 | 5/2018 | Foss et al. | |
| 2018/0369952 A1 * | 12/2018 | Hunstig | B23K 20/004 |

\* cited by examiner

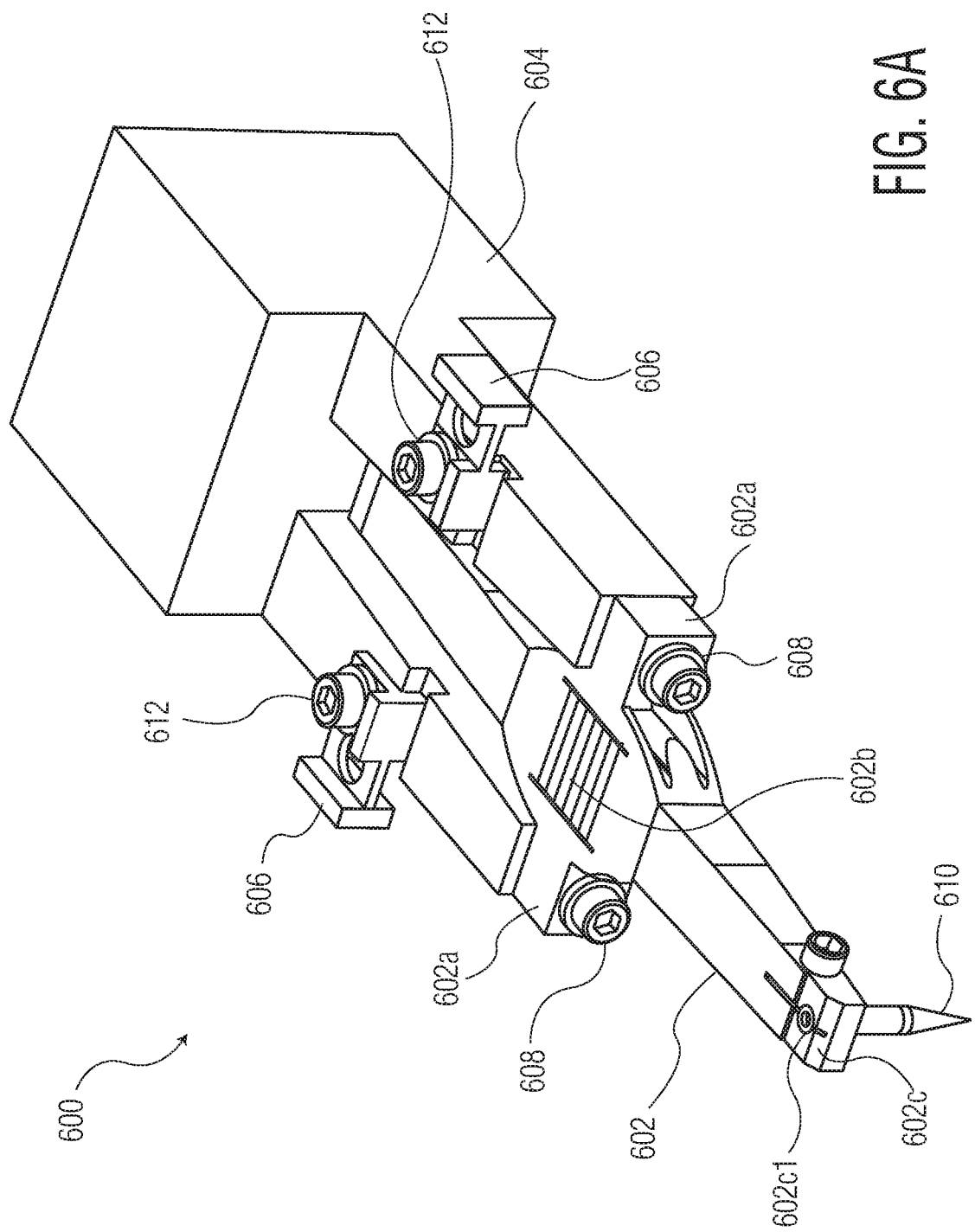

ULTRASONIC TRANSDUCER SYSTEMS INCLUDING TUNED RESONATORS, EQUIPMENT INCLUDING SUCH SYSTEMS, AND METHODS OF PROVIDING THE SAME

CROSS REFERENCE

This application is a continuation of U.S. patent application Ser. No. 15/894,617 filed on Feb. 12, 2018, which claims the benefit of U.S. Provisional Patent Application No. 62/460,793 filed Feb. 18, 2017, the contents of both of which are incorporated herein by reference.

FIELD

The invention relates to ultrasonic transducer systems, and more particularly, to improved ultrasonic transducer systems including tuned resonators, as well as equipment including such ultrasonic transducer systems, and methods of using the same.

BACKGROUND

Ultrasonic transducers are used in various applications. For example, such ultrasonic transducers are widely used in semiconductor packaging equipment such as automatic wire bonding machines (e.g., ball bonding machines, wedge bonding machines, ribbon bonding machines, etc.) and advanced packaging machines (e.g., flip chip bonding machines such as thermocompression bonding machines, etc.).

An exemplary conventional wire bonding sequence includes: (1) forming a first bond of a wire loop on a bonding location of a first semiconductor element (such as a semiconductor die) using a wire bonding tool; (2) extending a length of wire, continuous with the first bond, from the first semiconductor element to a second semiconductor element (or a substrate, such as a leadframe, supporting the first semiconductor element); (3) bonding the wire to a bonding location of the second semiconductor element (or the substrate), using the bonding tool, to form a second bond of the wire loop; and (5) severing the wire from a wire supply, thereby forming the wire loop. In forming the bonds between (a) the ends of the wire loop, and (b) the bond locations, ultrasonic energy provided by an ultrasonic transducer is utilized.

An exemplary flip chip bonding sequence includes: (1) aligning first conductive structures of a first semiconductor element (such as a semiconductor die) with second conductive structures of a second semiconductor element; (2) bonding the first semiconductor element to the second semiconductor element utilizing ultrasonic bonding energy (and perhaps heat and/or force) such that corresponding pairs of the first conductive structures and second conductive structures are bonded together (where solder material may be included in the interconnection between the first conductive structures and the second conductive structures).

U.S. Pat. No. 5,595,328 (titled "SELF ISOLATING ULTRASONIC TRANSDUCER"); U.S. Pat. No. 5,699,953 (titled "MULTI RESONANCE UNIBODY ULTRASONIC TRANSDUCER"); U.S. Pat. No. 5,884,834 (titled "MULTI-FREQUENCY ULTRASONIC WIRE BONDER AND METHOD"); U.S. Pat. No. 7,137,543 (titled "INTEGRATED FLEXURE MOUNT SCHEME FOR DYNAMIC ISOLATION OF ULTRASONIC TRANSDUCERS"); U.S. Pat. No. 8,251,275 (titled "ULTRASONIC TRANSDUCERS FOR WIRE BONDING AND METHODS OF FORMING WIRE BONDS USING ULTRASONIC TRANSDUCERS"); and U.S. Pat. No. 9,136,240 (titled "SYSTEMS AND METHODS FOR BONDING SEMICONDUCTOR ELEMENTS") relate to ultrasonic transducers and are herein incorporated by reference in their entirety. Ultrasonic bonding energy is typically applied using an ultrasonic transducer, where the bonding tool is attached to the transducer. The transducer typically includes a driver such as a stack of piezoelectric elements (e.g., piezoelectric crystals, piezoelectric ceramics, etc.). Electrical energy is applied to the driver, and converts the electrical energy to mechanical energy, thereby moving the bonding tool tip in a scrubbing motion.

In the use of such transducers, challenges exist when the mounting structure has a resonant frequency that coincides with (or is near) an operating mode of the transducer. Such challenges are particularly difficult with respect to ultrasonic transducers configured to operate at a plurality of frequencies. That is, while certain transducers may be optimized for operation at a first operating mode (e.g., a high frequency mode), the transducers may have issues with impedance stability at a second operating mode (e.g., a low frequency mode). For example, high impedance may result at the second operating mode, with the high impedance causing field issues (e.g., ultrasonic tuning failures).

It would be desirable to provide improved ultrasonic transducers for use in connection with various applications such as semiconductor packaging equipment (e.g., automatic wire bonding machines, advanced packaging machines, etc.).

SUMMARY

According to an exemplary embodiment of the invention, an ultrasonic transducer system is provided. The ultrasonic transducer system includes: a transducer mounting structure; a transducer, including at least one mounting flange for coupling the transducer to the transducer mounting structure; and a tuned resonator having a desired resonant frequency, the tuned resonator being integrated with at least one of the transducer mounting structure and the at least one mounting flange.

According to another exemplary embodiment of the invention, a wire bonding machine is provided. The wire bonding machine includes: a support structure for supporting a workpiece configured to receive wire bonds during a wire bonding operation; a wire bonding tool configured to form the wire bonds on the workpiece; and an ultrasonic transducer system such as those described herein (which may be considered as including the bonding tool), or other ultrasonic transducer systems within the scope of the invention.

According to another exemplary embodiment of the invention, a flip chip bonding machine is provided. The wire bonding machine includes: a support structure for supporting a workpiece configured to receive a semiconductor element during a flip chip bonding operation; a bonding tool configured to bond the semiconductor element to the substrate; and an ultrasonic transducer system such as those described herein (which may be considered as including the bonding tool), or other ultrasonic transducer systems within the scope of the invention.

According to other exemplary embodiments of the invention, methods of providing (e.g., using) an ultrasonic transducer system (such as those disclosed and claimed herein) are provided. An exemplary method of providing an ultrasonic transducer system includes the steps of: (i) providing a transducer and a transducer mounting structure; (ii) coupling the transducer to the transducer mounting structure using at least one mounting flange of the transducer; and (iii) integrating a tuned resonator having a desired resonant frequency with at least one of the transducer mounting structure and the at least one mounting flange.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 6A is a perspective view of yet another ultrasonic transducer system in accordance with another exemplary embodiment of the invention;

DETAILED DESCRIPTION

Figure 1A:
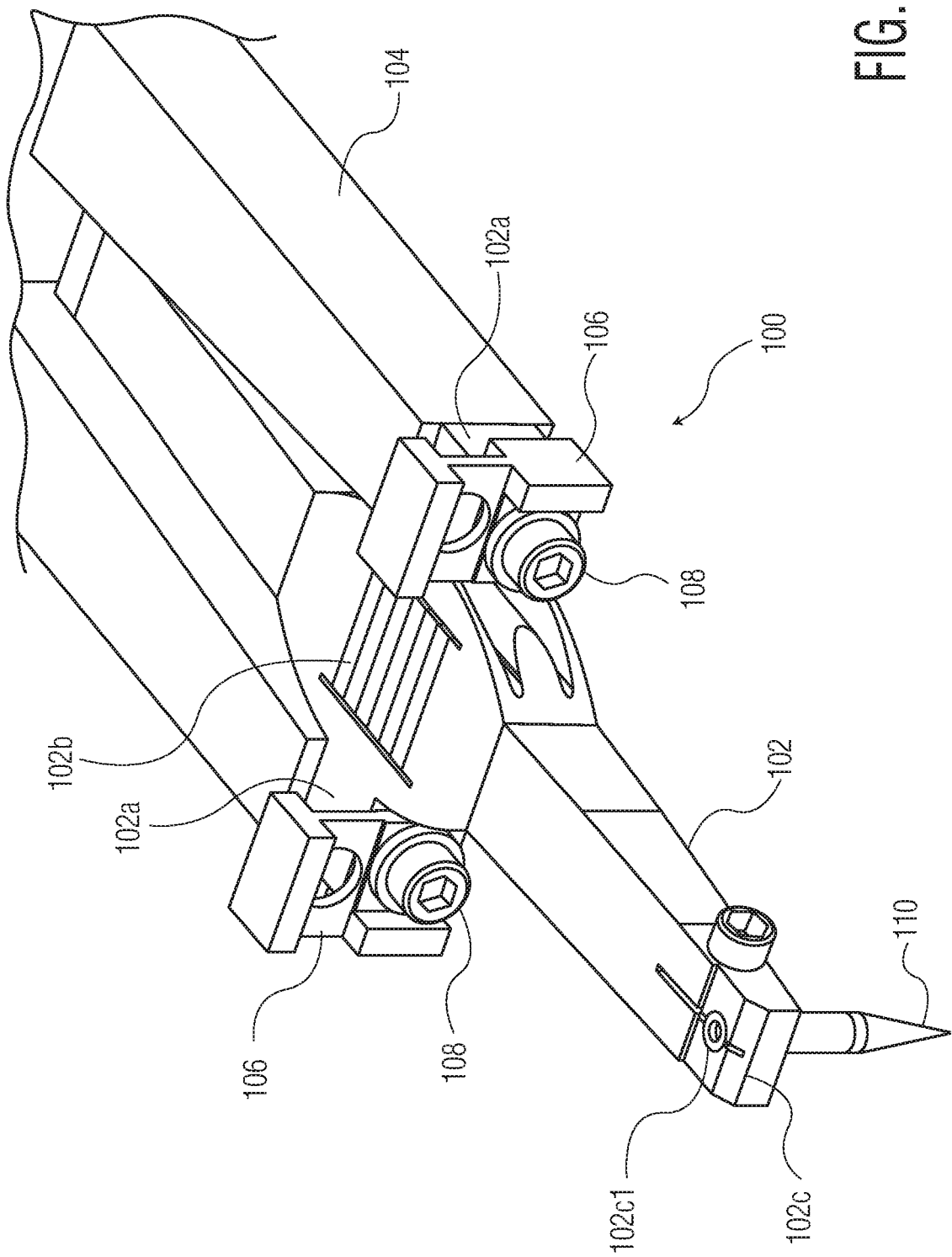
FIG. 1A is a perspective view an ultrasonic transducer system in accordance with an exemplary embodiment of the invention.

As used herein, the term "semiconductor element" is intended to refer to any structure including (or configured to include at a later step) a semiconductor chip or die. Exemplary semiconductor elements include a bare semiconductor die, a semiconductor die on a substrate/workpiece (e.g., a leadframe, a PCB, a carrier, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

According to various exemplary embodiments of the invention, one or more mechanical resonators, tuned to an ultrasonic transducer operating frequency, are used as vibration absorbers to provide dynamic isolation in the mounting of ultrasonic transducers. That is, according to the invention, the dynamic interaction or "coupling" between the ultrasonic transducer and a mounting structure of the ultrasonic transducer is reduced via active vibration absorption. Reducing the coupling between the transducer and the mounting structure provides better dynamic isolation, resulting in lower operating impedance, less heat-generation, more consistent motion, and thus an overall improvement in operating efficiency and performance of the transducer. Aspects of the invention may be applied as a retrofit to existing applications (e.g., existing semiconductor packaging machines) or for new applications (e.g., newly designed semiconductor packaging machines).

Thus, the use of one or more active tuned mechanical resonators (where the tuned resonator may be considered to include a plurality of tuned resonators or tuned resonator elements, where the tuned resonator may be integrated into the transducer system by removing material by one or more elements of the system, etc.) for vibration absorption at ultrasonic frequencies provides dynamic isolation between an ultrasonic transducer and the mounting structure regardless of the resonances inherent in the mount. This is in sharp contrast at prior attempts at dynamic isolation which have focused on passive methods such as the addition of dampening elements (e.g., rubber o-rings).

The dynamic isolation between an ultrasonic transducer and the mounting structure is a significant challenge, for example, because mounting structures typically have numerous resonances at ultrasonic frequencies that are difficult to predict (e.g., via finite element analysis, FEA). These structural resonances can be variable due to tolerances, and boundary condition changes, such as from mounting and un-mounting the transducer. Since the mechanical resonator is tuned to the operating frequency of the transducer, it has the ability to provide active vibration absorption and isolation by continuously "pushing away" any structural resonances that would encroach (randomly or consistently) upon the transducer operating frequency. This allows the transducer designer more freedom in the design of the mounting structure with less concern for dynamic coupling issues.

Impedance variability in ultrasonic transducers may be caused by the dynamic interaction between the transducer and the transducer mounting structure (e.g., a z-axis link, etc.). An operating mode of the transducer (e.g., a low frequency mode of a multi-frequency transducer) may have coupling with a parasitic mode, for example, that causes radial "pumping" of the mounting flange (e.g., mounting ears) used to couple the transducer to the transducer mounting structure. This coupling tends to excite several modes in the transducer mounting structure that coincide with (or are nearby) the operating mode of the transducer.

According to exemplary aspects of the invention, a tuned resonator is used to move a parasitic resonant mode away from the operating mode of a transducer. That is, the tuned resonator (e.g., where the resonator is mounted to the transducer, mounted to the transducer mounting structure, formed in the transducer or mounting structure, etc.) results in vibration absorption by providing an offsetting mass at the structural mode frequency. The resonator may be tuned, for example, using FEA analysis.

Figure 1B:
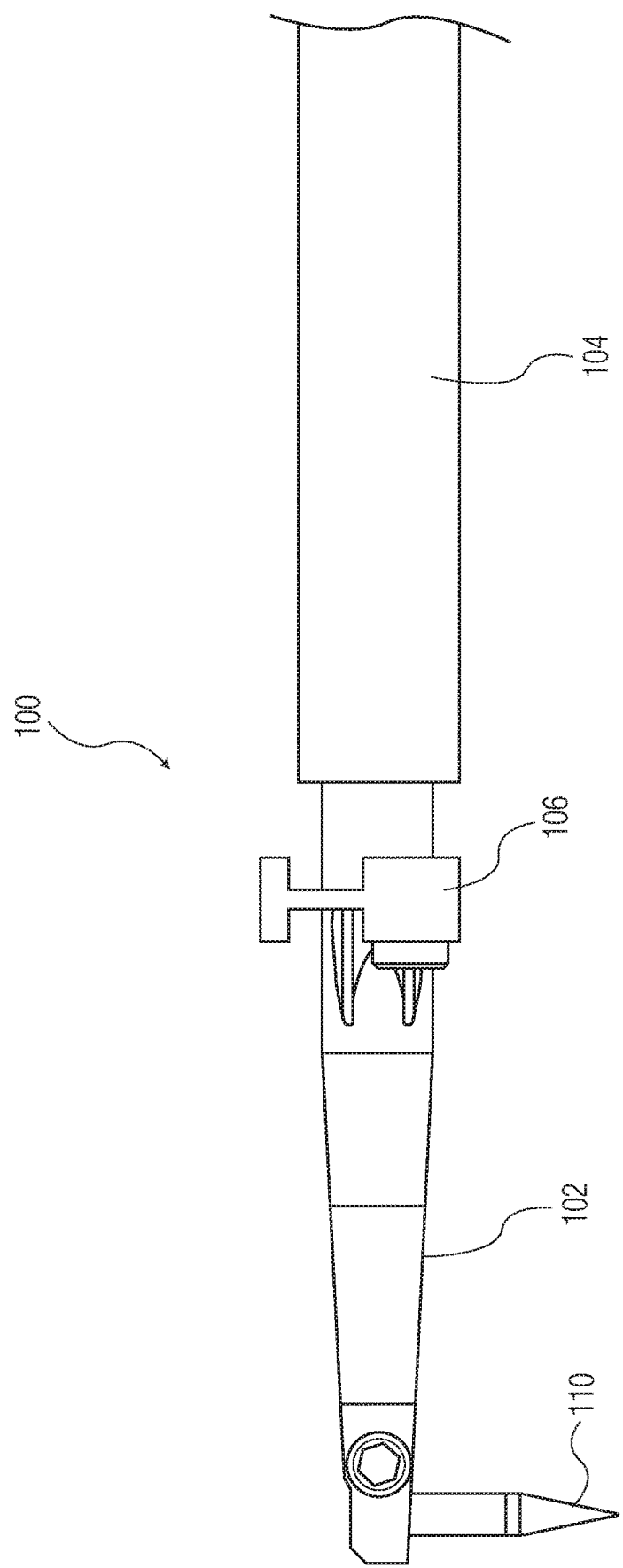
FIG. 1B is a side view of the ultrasonic transducer system of FIG. 1A.
Figure 1C:
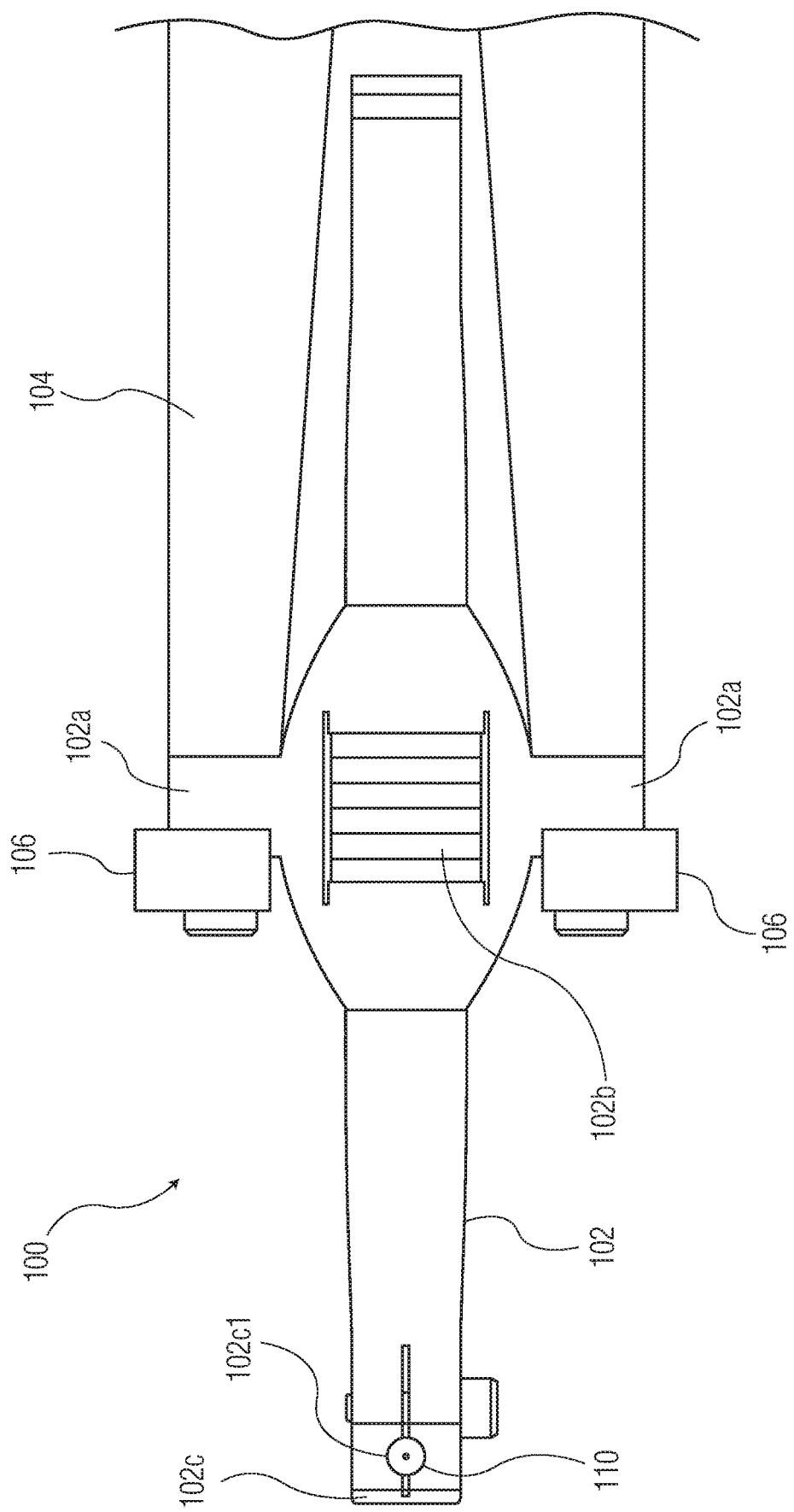
FIG. 1C is a top view of the ultrasonic transducer system of FIG. 1A.

Referring now to the drawings, FIGS. 1A-1C are various views of an ultrasonic transducer system 100 in accordance with an exemplary embodiment of the invention. Ultrasonic transducer system 100 includes a transducer 102 coupled to a transducer mounting structure 104. Transducer 102 includes mounting flanges 102a for securing transducer 102 to transducer mounting structure 104. Fasteners 108 are used to couple transducer 102 to transducer mounting structure 104 via mounting flanges 102a. Transducer 102 includes a driver 102b (e.g., a stack of piezoelectric elements) and a working end 102c. Working end 102c defines an aperture 102c1 configured to receive a wire bonding tool 110.

Ultrasonic transducer system 100 also includes tuned resonators 106 (which may also be referred to as tuned resonator elements), where one of the tuned resonators 106 is provided at each interface (i.e., connection region) between transducer 102 and transducer mounting structure 104. Each tuned resonator 106 has a desired resonant frequency, and is integrated with a mounting flange 102a to prevent dynamic interaction or "coupling" from occurring in mounting structure 104. In the example of FIGS. 1A-1C, tuned resonators 106 are inserted as mounting washers under fasteners (e.g., screws) 108 used to secure transducer 102 to transducer mounting structure 104. Tuned resonators 106 (e.g., in the form of the illustrated mounting washers) may be coupled directly, or indirectly, to transducer mounting structure 104.

Figure 2:
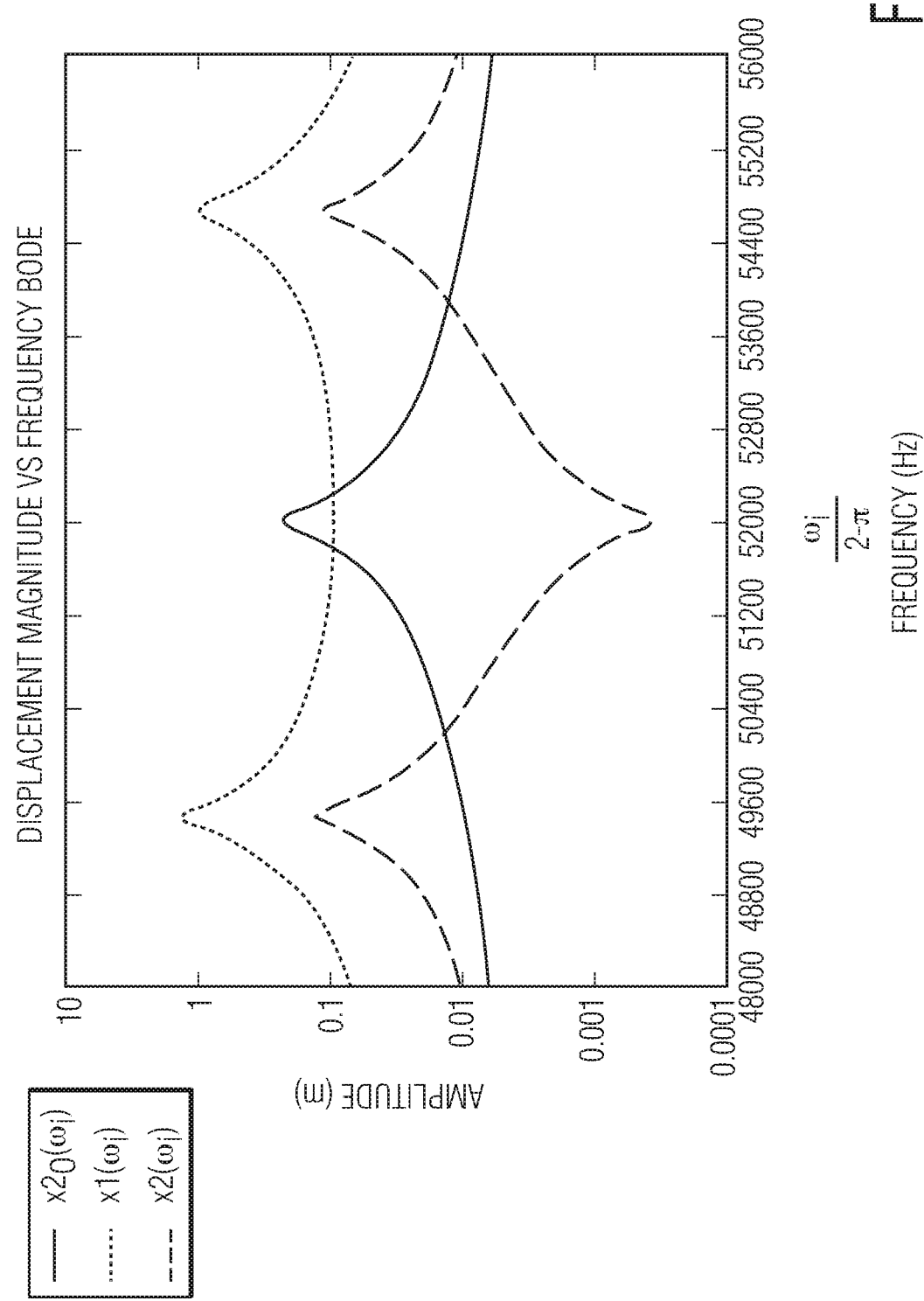
FIG. 2 is a graph illustrating movement of a mounting structure resonant frequency away from an operating frequency of an ultrasonic transducer, such that the transducer can operate without substantially interacting with the mounting structure, in accordance with an exemplary embodiment of the invention.

FIG. 2 is a graph illustrating movement of a mounting structure resonant frequency away from an operating frequency (52 kHz) of an ultrasonic transducer such that the transducer is no longer interacting with the mounting structure operating at its resonant frequency. More specifically, $x2_0$ is the original configuration of the mounting structure which exhibits a resonant frequency that coincides with the transducer operating frequency (e.g., in this example, 52 kHz). x2 shows the movement (and splitting) of the mounting structure resonant frequency away from the transducer operating frequency, resulting in an amplitude node at the transducer operating frequency. x1 shows the amplitude of the resonator(s) relative to the mounting structure, which provides the offsetting dynamic mass for moving the mounting structure resonant frequency away from the transducer operating frequency. In this example, the mounting structure resonant frequency has been moved using the tuned resonators 106 illustrated in FIGS. 1A-1C.

Figure 3:
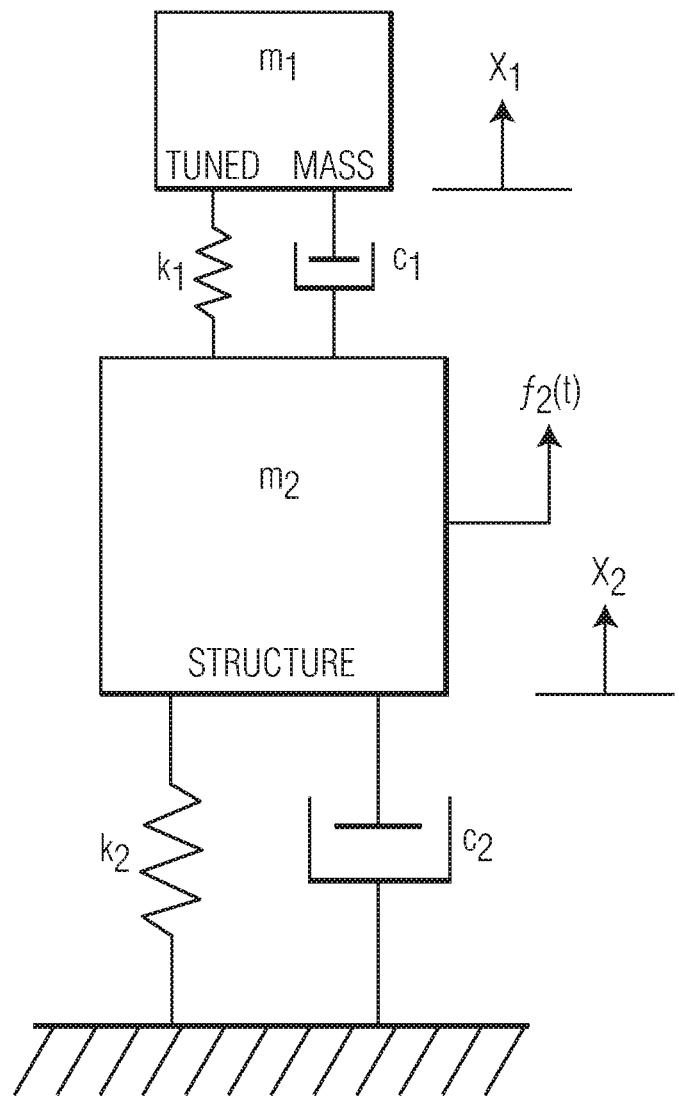
FIG. 3 is a block diagram of a spring-mass system in accordance with an exemplary embodiment of the invention.

FIG. 3 is a block diagram of a spring-mass system illustrating the structural mass $m_2$, and the addition of a tuned resonator mass $m_1$. As shown by the spring-mass model of FIG. 3, and the graph of FIG. 2, the addition of the tuned resonator mass mi causes a shift in the main structure resonance, creating new "split-modes" around the transducer operating frequency in the form of "in-phase" and "out-of-phase" modes with the tuned mass.

Figure 4:
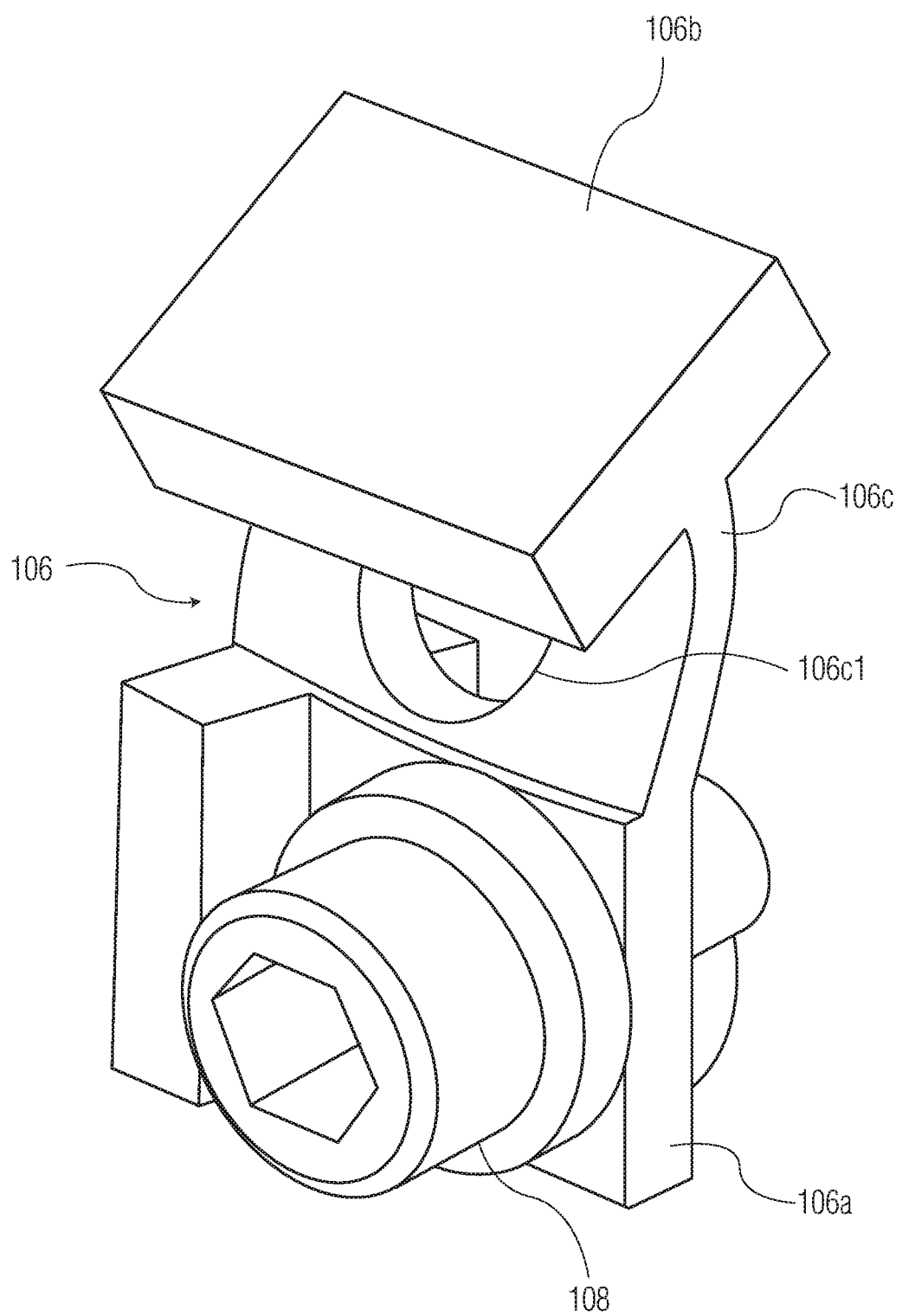
FIG. 4 is an illustration of a tuned resonator of the ultrasonic transducer system of FIGS. 1A-1C in accordance with an exemplary embodiment of the invention.

FIG. 4 illustrates a tuned resonator 106 (from FIGS. 1A-1C) shown in a bending operation through FEA modelling. Tuned resonator 106 includes: a fixed part 106a (configured to be coupled to a transducer mounting structure 104 using fastener 108 via mounting flange 102a) (corresponding to structure $m_2$ in FIG. 3); tuned mass 106b (corresponding to structure mi in FIG. 3); and spring part 106c (defining a hole or opening 106c1) (corresponding to spring $k_1$ in FIG. 3).

While FIGS. 1A-1C illustrate an example of tuned resonators 106 provided as "washers" engaged at mounting flanges 102a of transducer 102, it is understood that other alternative tuned resonators are contemplated. For example, see FIGS. 5A-5C, FIGS. 6A-6C, and FIGS. 7A-7C.

Figure 5A:
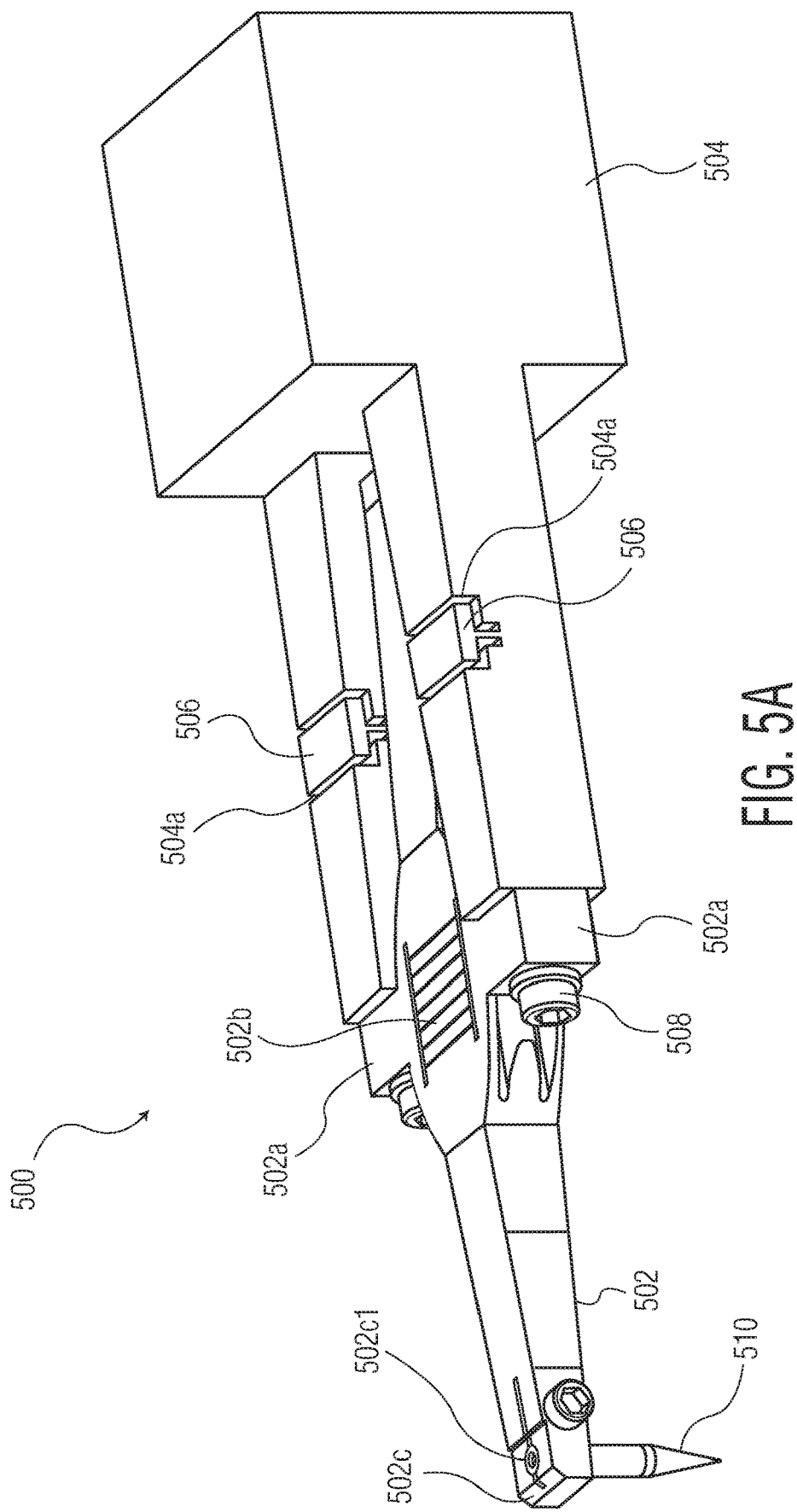
FIG. 5A is a perspective view of another ultrasonic transducer system in accordance with another exemplary embodiment of the invention.
Figure 5B:
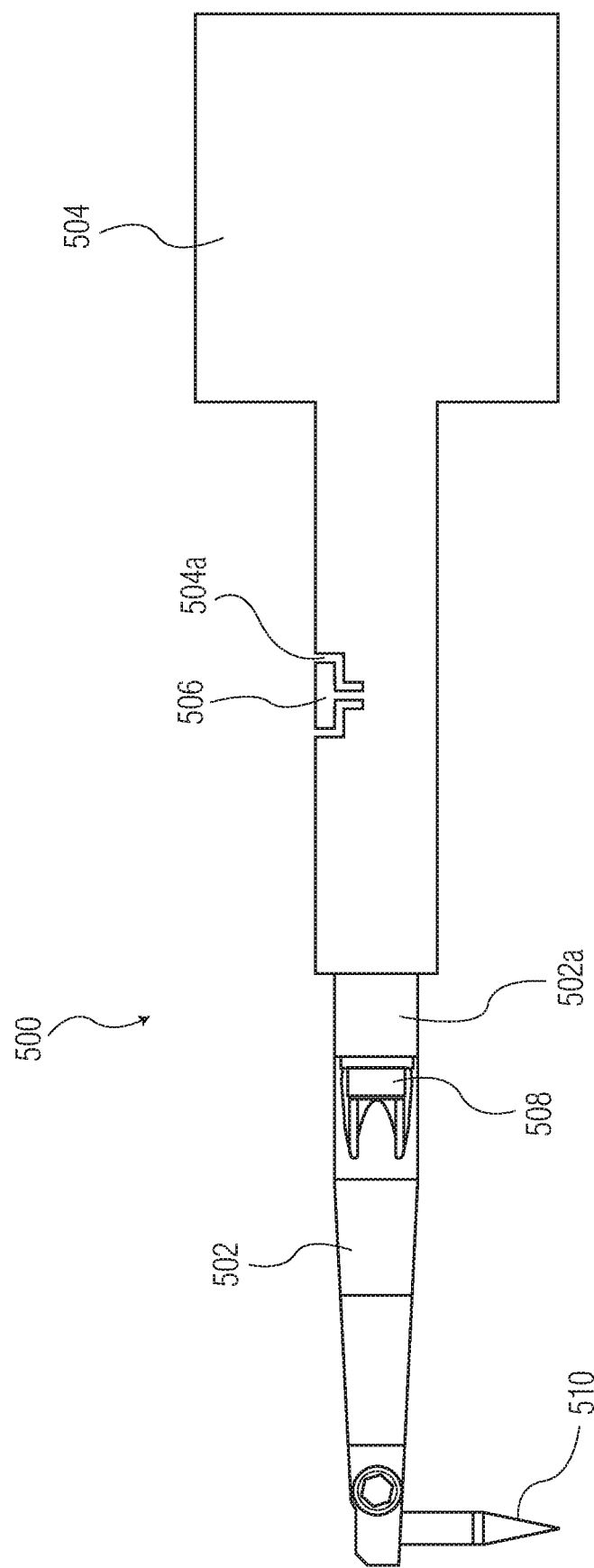
FIG. 5B is a side view of the ultrasonic transducer system of FIG. 5A.
Figure 5C:
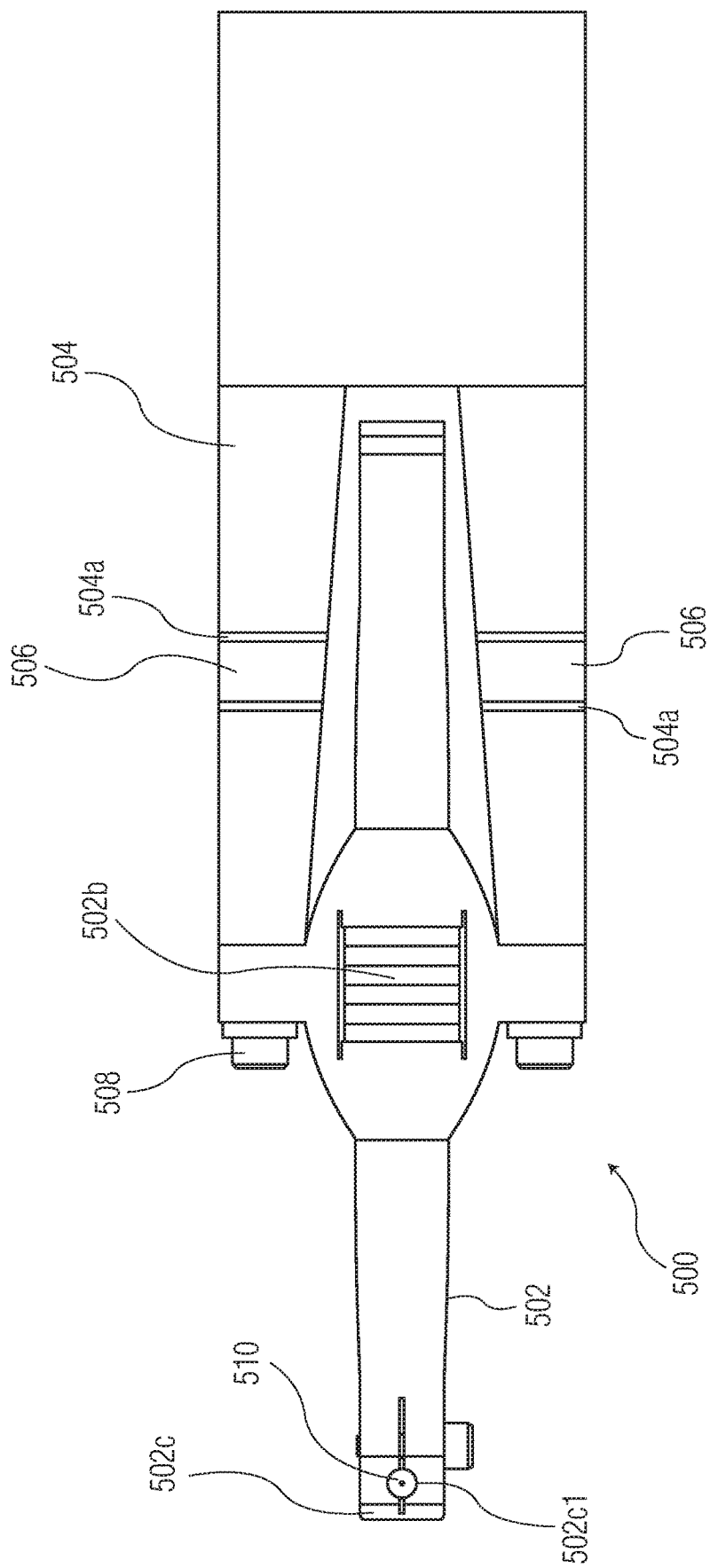
FIG. 5C is a top view of the ultrasonic transducer system of FIG. 5A.

Referring specifically to FIGS. 5A-5C, ultrasonic transducer system 500 is provided. Ultrasonic transducer system 500 includes a transducer 502 coupled to a transducer mounting structure 504. Transducer 502 includes mounting flanges 502a for securing transducer 502 to transducer mounting structure 504. Fasteners 508 are used to couple transducer 502 to transducer mounting structure 504 via mounting flanges 502a. Transducer 502 includes a driver 502b (e.g., a stack of piezoelectric elements) and a working end 502c. Working end 502c defines an aperture 502c1 configured to receive a wire bonding tool 510. Ultrasonic transducer system 500 also includes tuned resonators 506 integrated with transducer mounting structure 504 by removing material from transducer mounting structure 504 (e.g., by EDM, laser machining, etc.) such that spaces 504a are defined around portions of tuned resonators 506. Each tuned resonator 506 has a desired resonant frequency, and is integrated with transducer mounting structure 504 to prevent dynamic interaction or "coupling" from occurring in mounting structure 504.

Figure 6B:
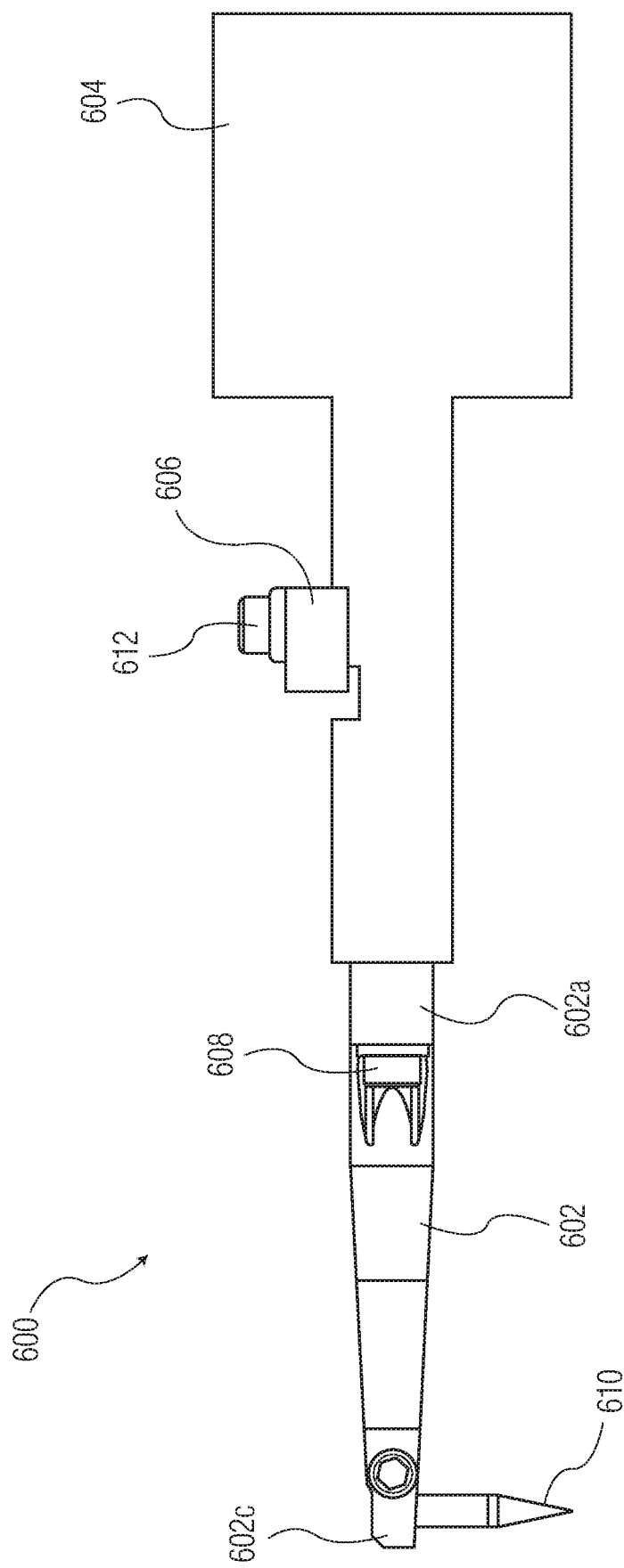
FIG. 6B is a side view of the ultrasonic transducer system of FIG. 6A.
Figure 6C:
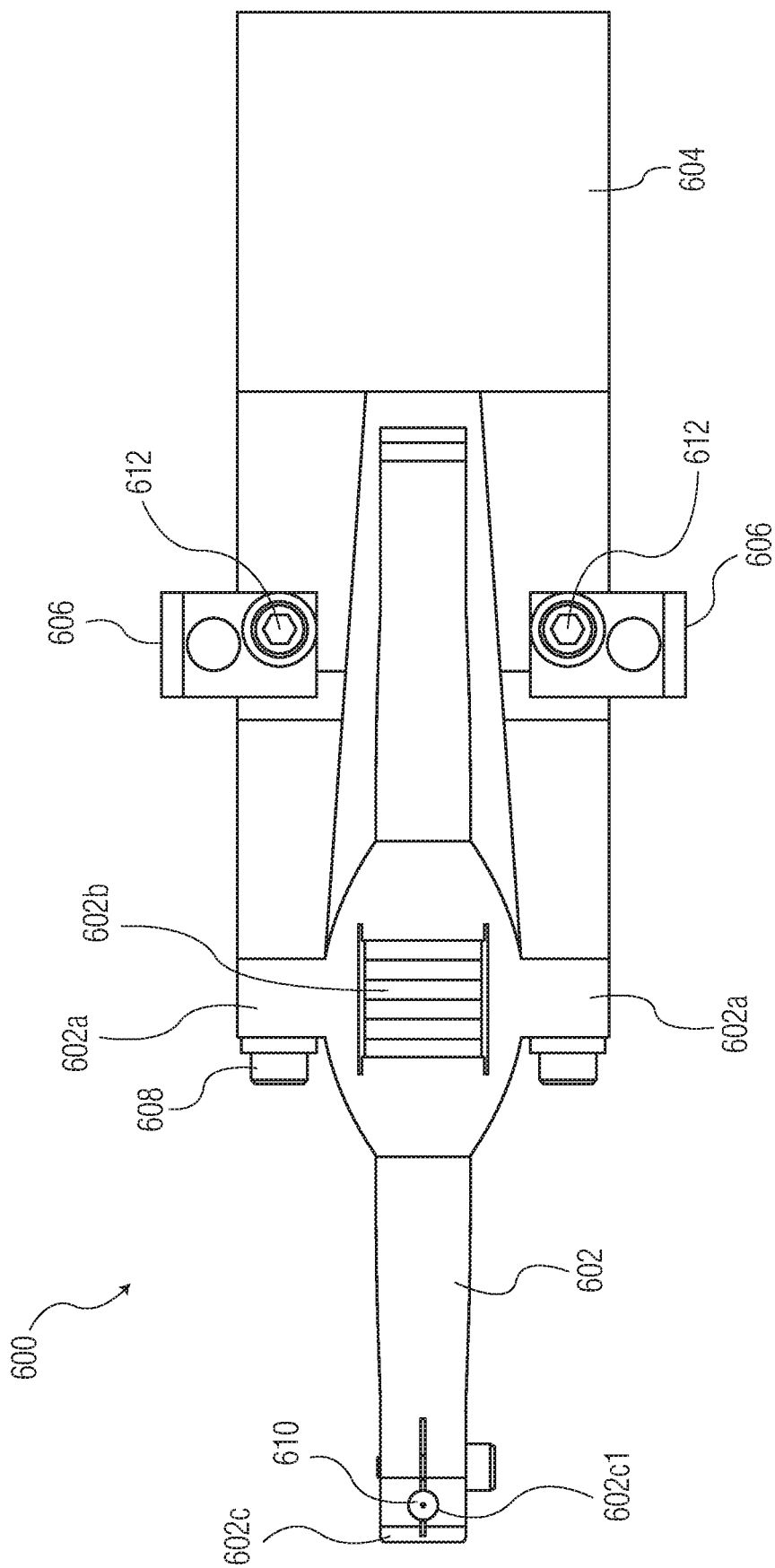
FIG. 6C is a top view of the ultrasonic transducer system of FIG. 6A.

Referring specifically to FIGS. 6A-6C, ultrasonic transducer system 600 is provided. Ultrasonic transducer system 600 includes a transducer 602 coupled to a transducer mounting structure 604. Transducer 602 includes mounting flanges 602a for securing transducer 602 to transducer mounting structure 604. Fasteners 608 are used to couple transducer 602 to transducer mounting structure 604 via mounting flanges 602a. Transducer 602 includes a driver 602b (e.g., a stack of piezoelectric elements) and a working end 602c. Working end 602c defines an aperture 602c1 configured to receive a wire bonding tool 610. Ultrasonic transducer system 600 also includes tuned resonators 606 integrated with transducer mounting structure 604 by securing tuned resonators 606 to transducer mounting structure 604 (where tuned resonator elements 606 may be directly, or indirectly, coupled to transducer mounting structure 604 using fasteners 612). Each tuned resonator 606 has a desired resonant frequency, and is integrated with transducer mounting structure 604 to prevent dynamic interaction or "coupling" from occurring in mounting structure 604.

Figure 7A:
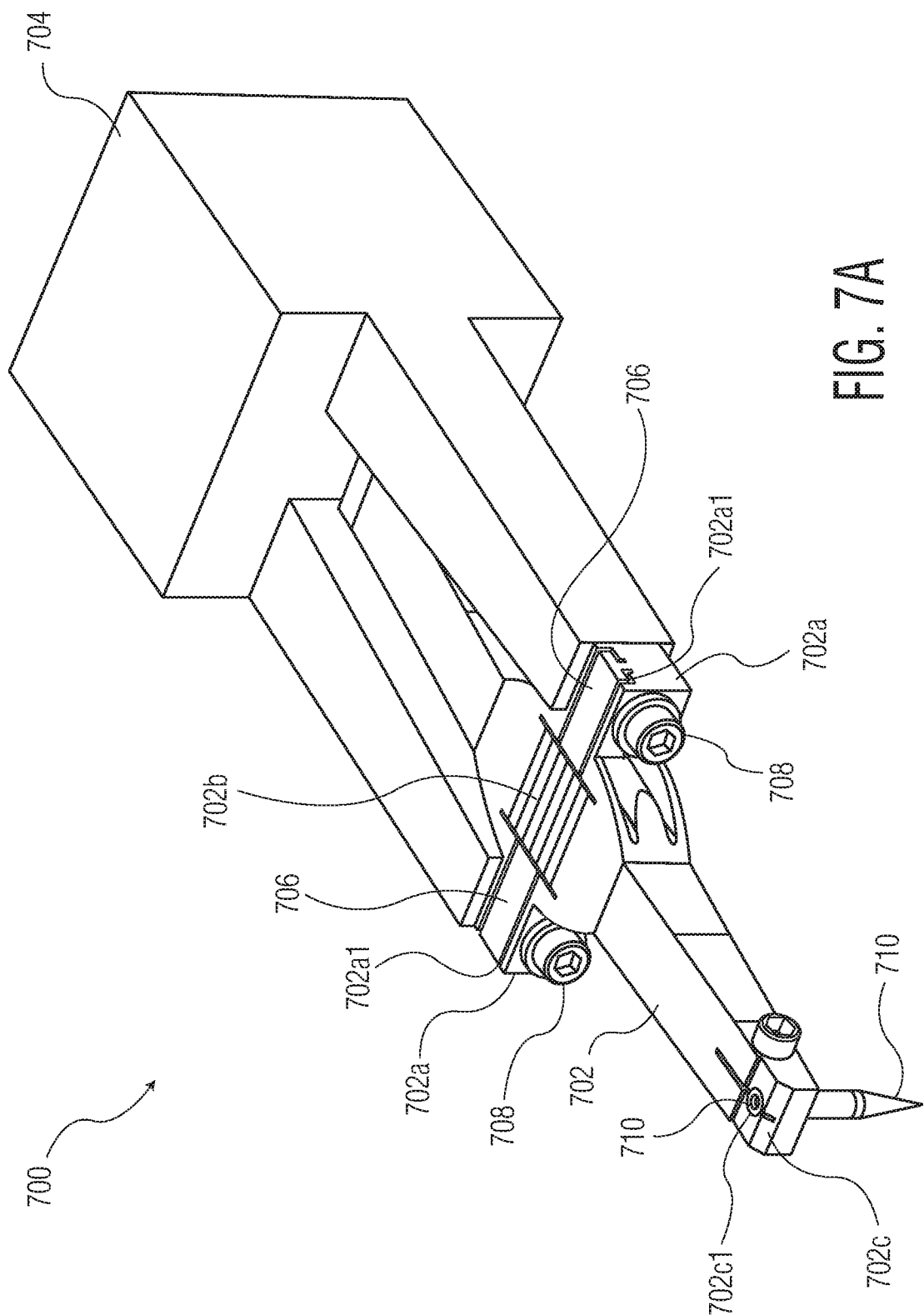
FIG. 7A is a perspective view of yet another ultrasonic transducer system in accordance with another exemplary embodiment of the invention.
Figure 7B:
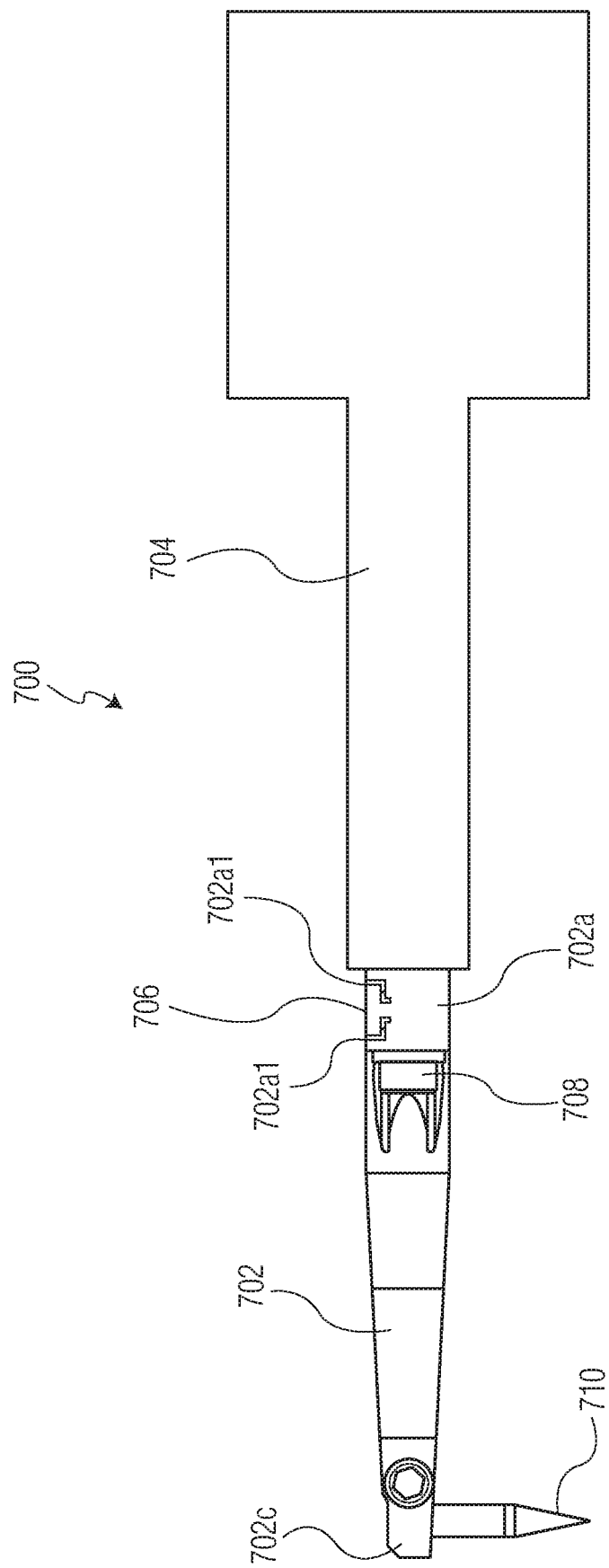
FIG. 7B is a side view of the ultrasonic transducer system of FIG. 7A.
Figure 7C:
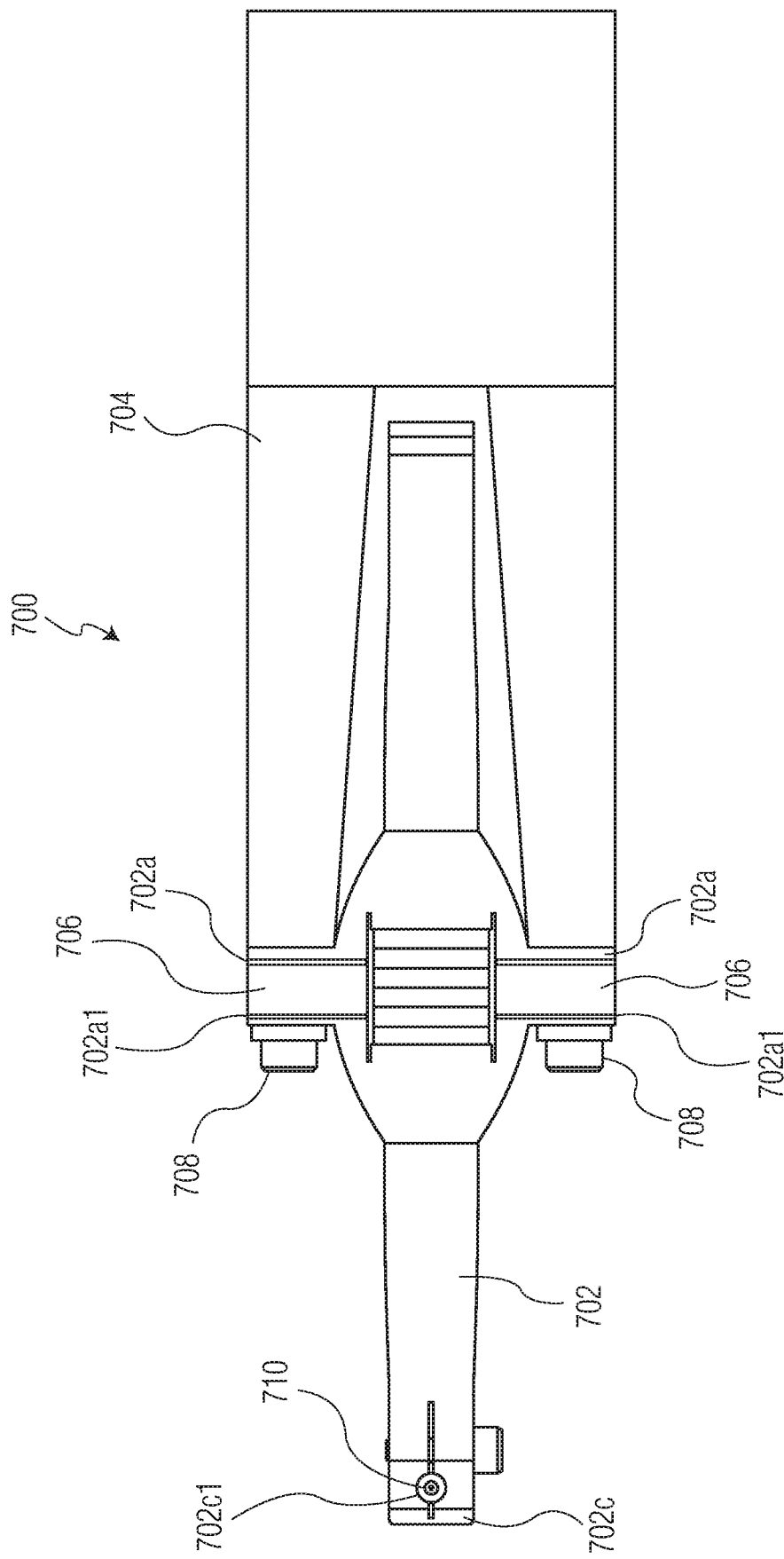
FIG. 7C is a top view of the ultrasonic transducer system of FIG. 7A.

Referring specifically to FIGS. 7A-7C, ultrasonic transducer system 700 is provided. Ultrasonic transducer system 700 includes a transducer 702 coupled to a transducer mounting structure 704. Transducer 702 includes mounting flanges 702a for securing transducer 702 to transducer mounting structure 704. Fasteners 708 are used to couple transducer 702 to transducer mounting structure 704 via mounting flanges 702a. Transducer 702 includes a driver 702b (e.g., a stack of piezoelectric elements) and a working end 702c. Working end 702c defines an aperture 702c1 configured to receive a wire bonding tool 710. Ultrasonic transducer system 700 also includes tuned resonators 706 integrated with mounting flanges 702a by removing material from mounting flanges 702a (e.g., by EDM, laser machining, etc.) such that spaces 702a1 are defined around portions of tuned resonators 706. Each tuned resonator 706 has a desired resonant frequency, and is integrated with mounting flanges 702a to prevent dynamic interaction or "coupling" from occurring in mounting structure 704.

Figure 8:
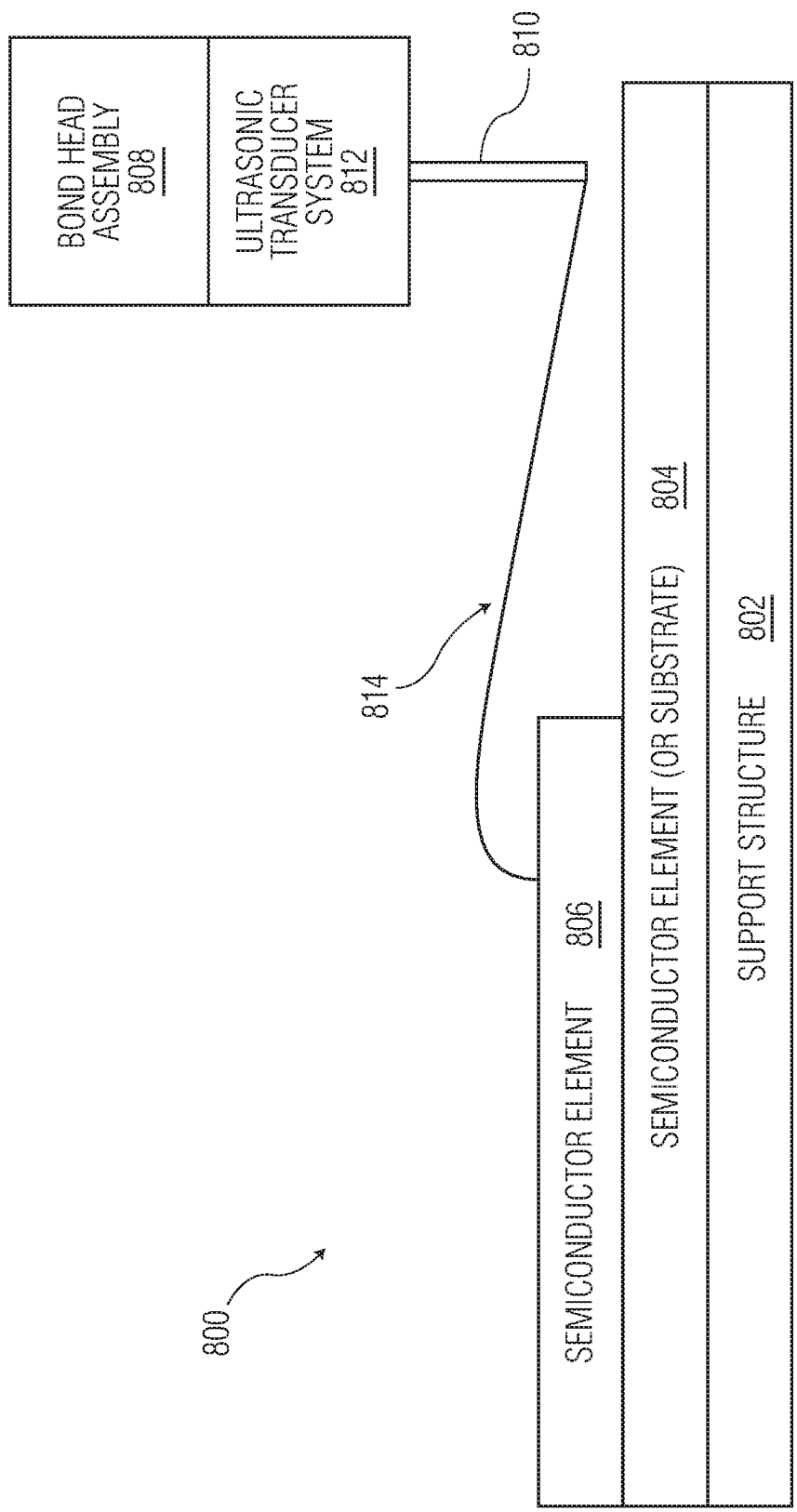
FIG. 8 is a block diagram of a wire bonding machine including an ultrasonic transducer system in accordance with an exemplary embodiment of the invention.

FIG. 8 is a block diagram of a wire bonding machine 800 including an ultrasonic transducer system 810, carried by a bond head assembly 808, in accordance with an exemplary embodiment of the invention. Ultrasonic transducer system 812 may correspond to any ultrasonic transducer system within the scope of the invention such as ultrasonic transducer system 100 (see FIGS. 1A-1C), ultrasonic transducer system 500 (see FIGS. 5A-5C), ultrasonic transducer system 600 (see FIGS. 6A-6C), or ultrasonic transducer system 700 (see FIGS. 7A-7C). Wire bonding machine 800 also includes a support structure 802 supporting semiconductor element 804 (or substrate 804, such as a leadframe). Semiconductor element 806 is supported by semiconductor element 804. A wire loop is being formed between semiconductor element 806 and semiconductor element 804. Wire loop 814 includes a first bond bonded to a bonding location on semiconductor element 806 (using the wire bonding tool 810), a length of wire extending from the first bond, and will include a second bond bonded to a bonding location on semiconductor element 804. Wire bonding tool 810 (of ultrasonic transducer system 812) is carried by a transducer of ultrasonic transducer system 812 (where the transducer is not specifically shown in FIG. 8, but see transducers 102, 502, 602, and 702 in FIGS. 1A-1C, 5A-5C, 6A-6C, and 7A-7C, respectively).

Figure 9:
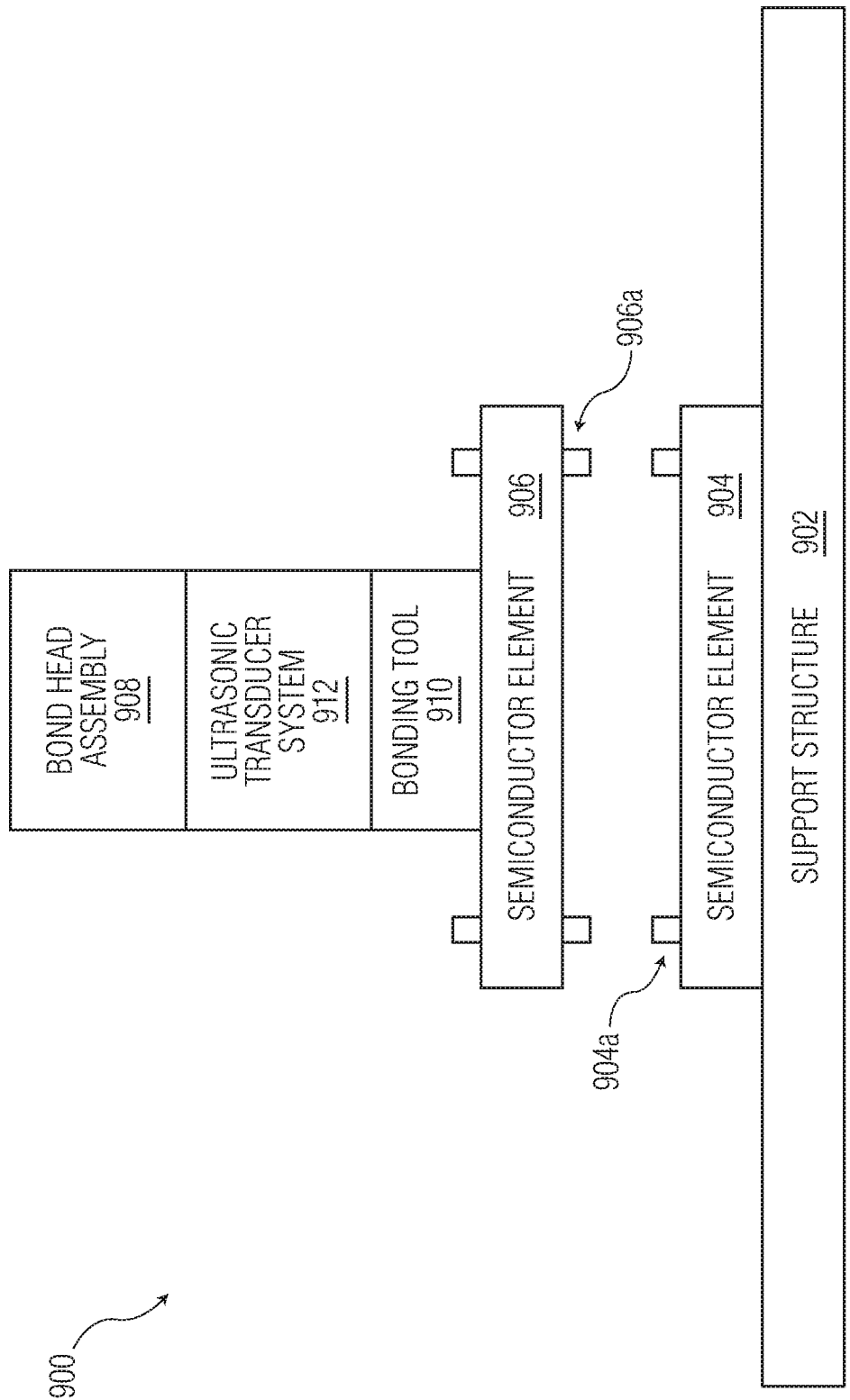
FIG. 9 is a block diagram of a flip chip bonding machine including an ultrasonic transducer system in accordance with an exemplary embodiment of the invention.

FIG. 9 is a block diagram of a flip chip bonding machine 900 including an ultrasonic transducer system 912 in accordance with an exemplary embodiment of the invention. While ultrasonic transducer system 912 is part of a flip chip bonding machine (as opposed to a wire bonding machine shown in FIG. 8, or contemplated in FIGS. 1A-1C, 5A-5C, 6A-6C, and 7A-7C), the teachings of the various aspects of the invention may have use in varying applications such as, for example, flip chip bonding machines. Thus, in a flip chip bonding machine (such as in FIG. 9), a tuned resonator may be provided (e.g., by integrating a tuned resonator by adding elements, or removing material, as described in connection with the various embodiments of the invention such as in connection with FIGS. 1A-1C, 5A-5C, 6A-6C, and 7A-7C).

Flip chip bonding machine 900 includes a support structure 902 supporting semiconductor element 904 including electrically conductive structures 904a (only two electrically conductive structures 904a are shown, but it is understood that many conductive structures may be provided). Bonding tool 910 (carried by a transducer included in ultrasonic transducer system 912) is part of bond head assembly 908. Bonding tool 910 carries semiconductor element 906, including electrically conductive structures 906a (only two electrically conductive structures 906a are shown, but it is understood that many conductive structures may be provided). Electrically conductive structures 906a are aligned with electrically conductive structures 904a before bonding of semiconductor element 906 to semiconductor element 904 using bonding tool 910 (utilizing ultrasonic bonding energy provided by transducer).

Ultrasonic transducer system 912 includes (a) a transducer mounting structure, (b) a transducer, including at least one mounting flange for coupling the transducer to the transducer mounting structure, and (c) a tuned resonator having a desired resonant frequency. While these individual elements are not shown in FIG. 9, it is understood that such elements may be similar to those in FIGS. 1A-1C, 5A-5C, 6A-6C, and 7A-7C, except for the change in application (e.g., wire bonding versus flip chip bonding). The tuned resonator is integrated with at least one of the transducer mounting structure and the at least one mounting flange with the same functional objective as described in connection with the various exemplary embodiments of the invention described herein (e.g., where each tuned resonator has a desired resonant frequency, and is integrated with the transducer mounting structure and/or mounting flange(s) to prevent dynamic interaction or "coupling" from occurring in the transducer mounting structure).

Figure 10:
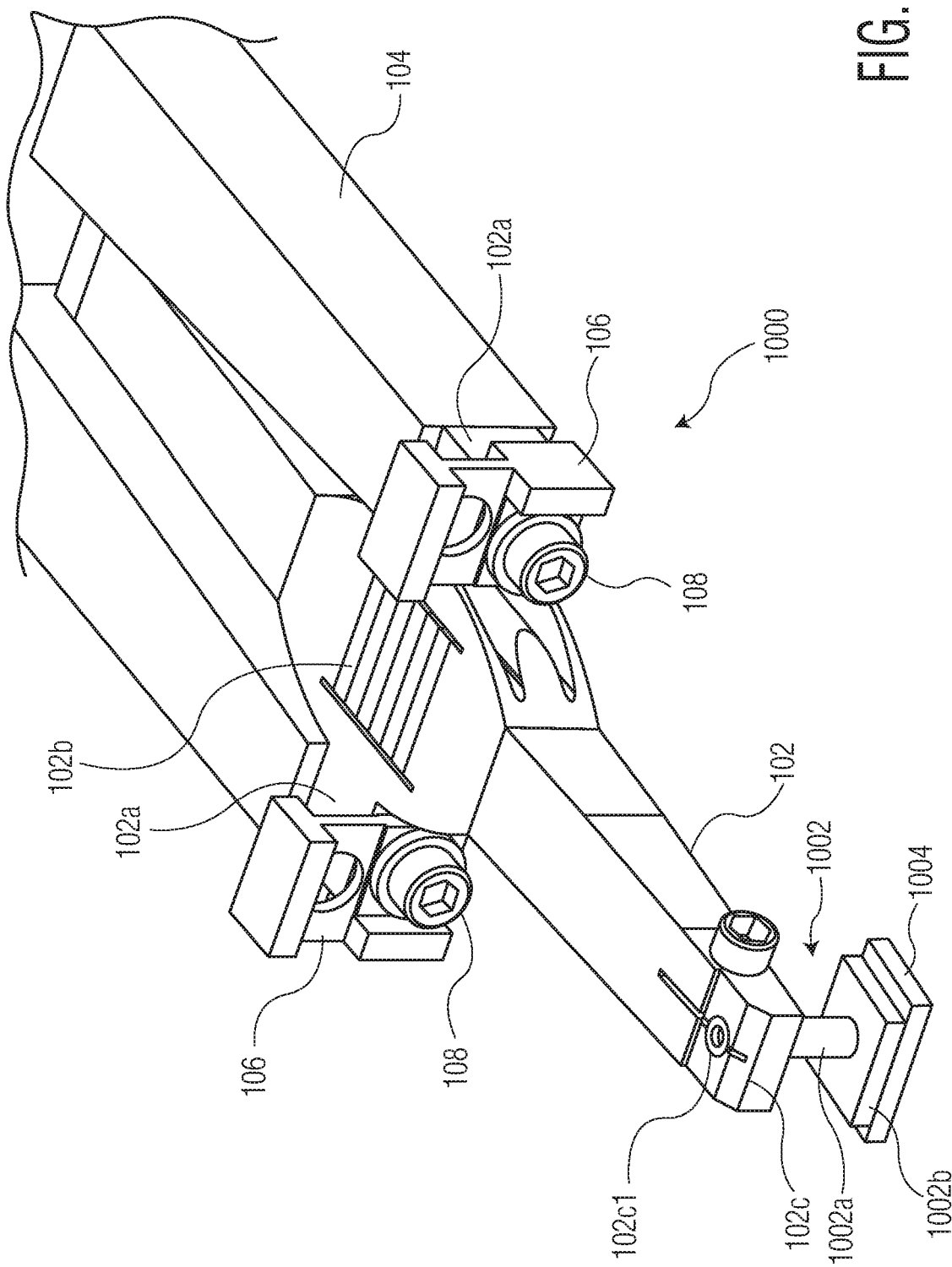
FIGS. 10-13 are perspective views of various ultrasonic transducer systems for flip chip bonding machines in accordance with various exemplary embodiments of the invention.
Figure 11:
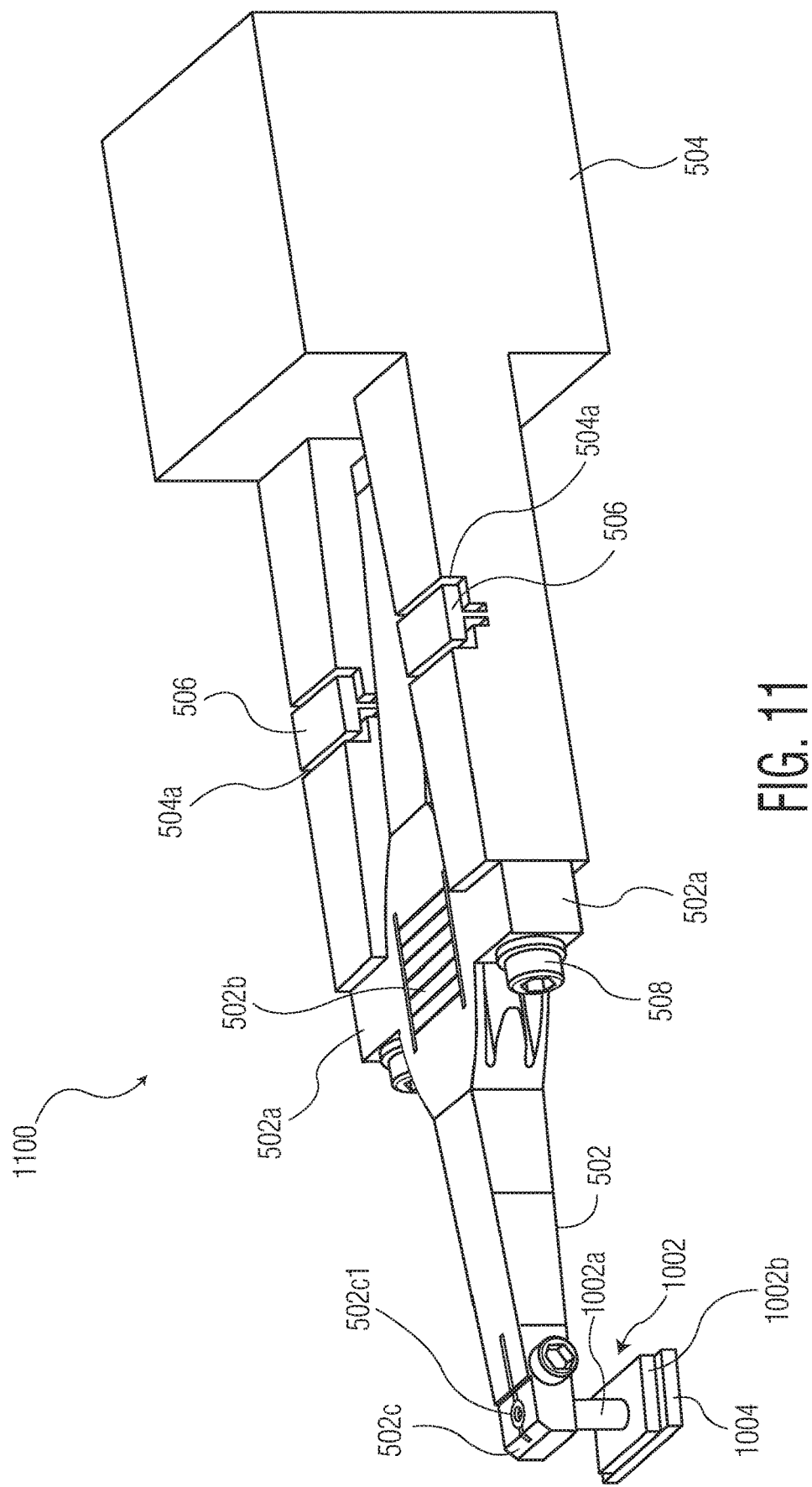
Figure 12:
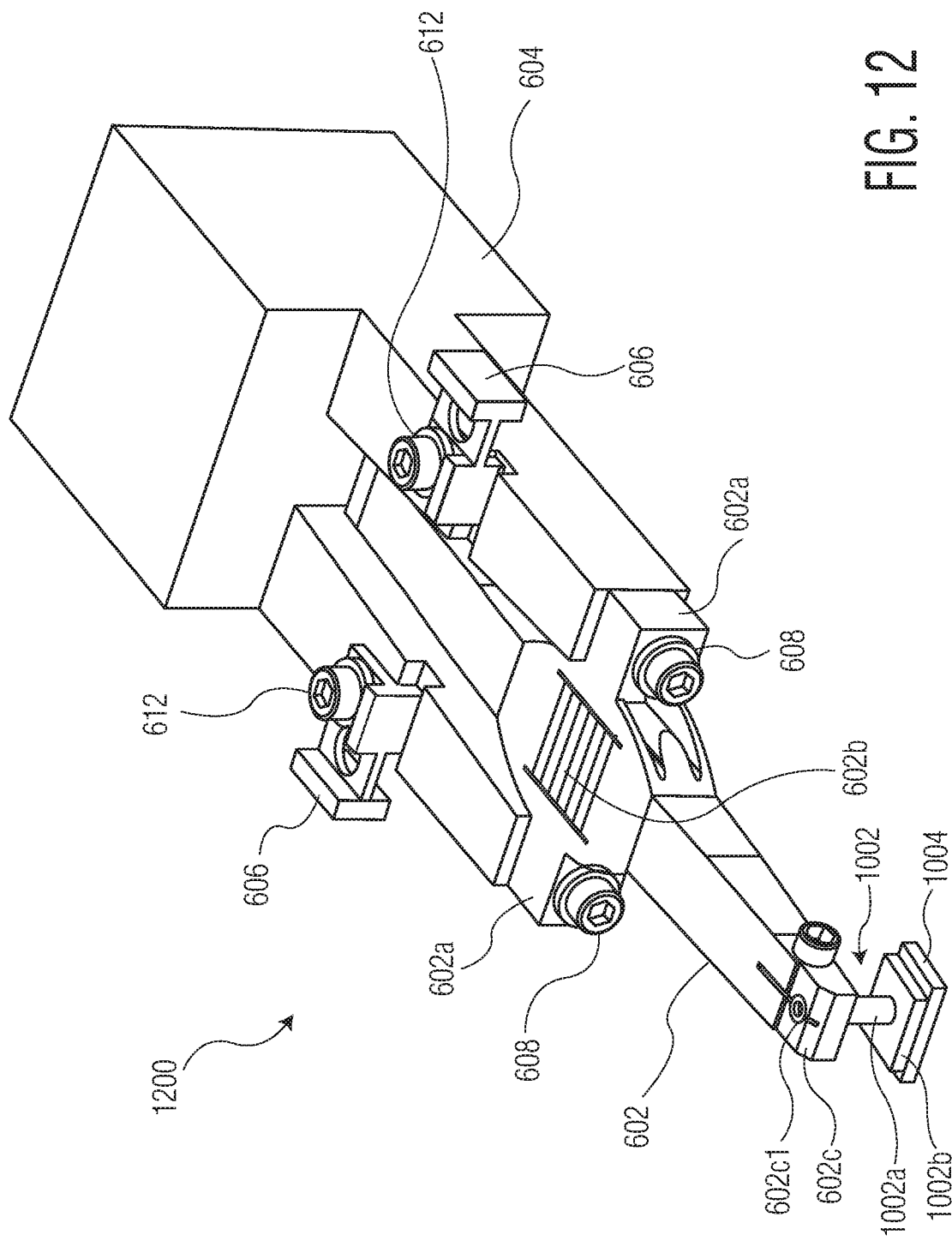
Figure 13:
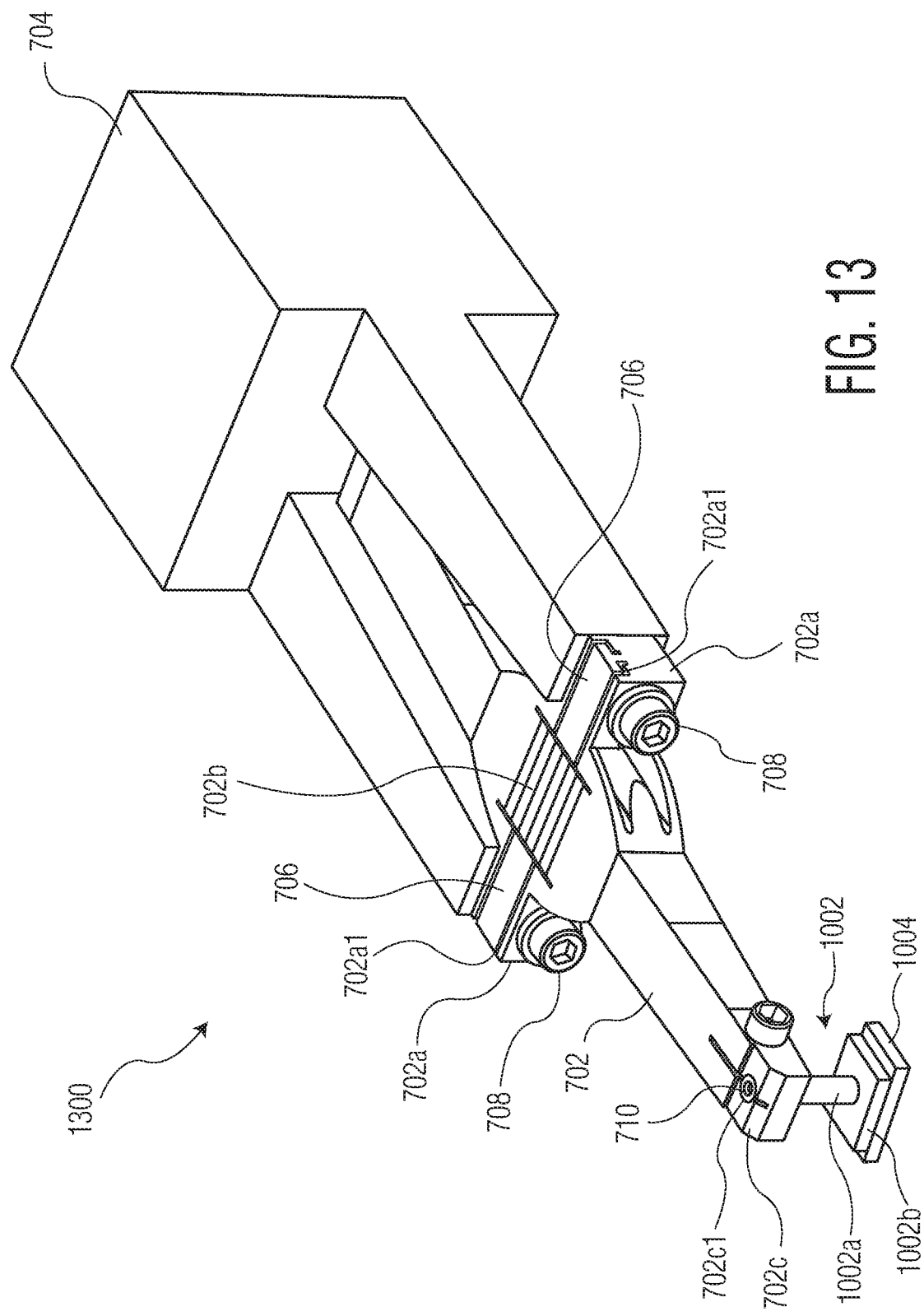

FIGS. 10-13 illustrate ultrasonic transducer systems 1000, 1100, 1200, and 1300 for flip chip bonding machines in accordance with various exemplary embodiments of the invention. More specifically, ultrasonic transducer system 912 of FIG. 9 may take any of a number of configurations, including those illustrated in FIGS. 10-13 in connection with ultrasonic transducer systems 1000, 1100, 1200, and 1300. For simplicity and ease of illustration: FIG. 10 is very similar to FIG. 1A, with like reference numerals pointing to like elements; FIG. 11 is very similar to FIG. 5A, with like reference numerals pointing to like elements; FIG. 12 is very similar to FIG. 6A, with like reference numerals pointing to like elements; and FIG. 13 is very similar to FIG. 7A, with like reference numerals pointing to like elements. Thus, a description of such elements with like reference numerals is omitted. However, each of FIGS. 10-13 illustrates a working end 102c, 502c, 602c, 702c of the respective transducer 102, 502, 602, 702. Each of these working ends 102c, 502c, 602c, 702c is holding a flip chip bonding tool 1002 including a shaft portion 1002a and a base portion 1002b. Base portion 1002b holds a semiconductor element 1004 (e.g., by vacuum or the like drawn through bonding tool 1002), and is configured to bond (e.g., where the bonding process includes ultrasonic bonding) semiconductor element 1004 in connection with a flipchip bonding operation.

Although the invention has been described primarily with respect to ultrasonic transducer systems for use in connection semiconductor packaging machines (e.g., wire bonding machines, flip chip bonding machines, wafer level bonding machines), it is not limited thereto. The teachings of the invention may be applicable to various additional applications of ultrasonic transducer systems outside of the area of semiconductor packaging.

Although the invention has been described primarily with respect to a tuned resonator (or a plurality of tuned resonators) tuned to an operating frequency of the transducer, it is contemplated that each of a plurality of tuned resonators may each be tuned to one of a plurality of operating frequencies of the transducer. For example, in FIGS. 1A-1C, two different tuned resonators 106 are shown. Each of these tuned resonators 106 may be tuned to the same operating frequency of the transducer, or each of these tuned resonators 106 may be tuned to different operating frequencies of the transducer. Further still, each tuned resonator 106 may be tuned to multiple operating frequencies of the transducer.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. An ultrasonic transducer system comprising:
a transducer mounting structure;
a transducer, including at least one mounting flange for coupling the transducer to the transducer mounting structure; and
a tuned resonator, the tuned resonator being integrated with at least one of the transducer mounting structure and the at least one mounting flange, the tuned resonator being tuned to an operating frequency of the transducer to provide active vibration absorption and isolation by continuously pushing away structural resonances that would encroach on the operating frequency.

2. The ultrasonic transducer system of claim 1 wherein the tuned resonator is configured to absorb vibration from the transducer mounting structure.

3. The ultrasonic transducer system of claim 1 wherein the tuned resonator is configured to move a resonant frequency of the transducer mounting structure away from the operating frequency of the transducer.

4. The ultrasonic transducer of claim 1 wherein the tuned resonator is coupled to the transducer mounting structure.

5. The ultrasonic transducer of claim 1 wherein the tuned resonator is coupled to the transducer mounting structure indirectly through at least one intermediate structure.

6. The ultrasonic transducer of claim 1 wherein the tuned resonator includes a plurality of tuned resonator elements coupled to the transducer mounting structure.

7. The ultrasonic transducer of claim 1 wherein the tuned resonator is coupled to the mounting flange.

8. The ultrasonic transducer of claim 1 wherein the tuned resonator is coupled to the mounting flange indirectly through at least one intermediate structure.

9. The ultrasonic transducer of claim 1 wherein the transducer includes a plurality of mounting flanges, and the tuned resonator includes a plurality of tuned resonator elements, each of the plurality of tuned resonator elements being coupled to a respective one of the plurality of mounting flanges.

10. The ultrasonic transducer of claim 1 wherein the tuned resonator may be modeled to include a mass and a spring having a resonant frequency tuned to a desired frequency, in particular with the operating frequency.

11. The ultrasonic transducer of claim 1 wherein the tuned resonator is integrated with the transducer mounting structure by removing material from the transducer mounting structure.

12. The ultrasonic transducer of claim 1 wherein the tuned resonator is integrated with the at least one mounting flange by removing material from the at least one mounting flange.

13. A wire bonding machine comprising:
a support structure for supporting a workpiece configured to receive wire bonds during a wire bonding operation;
a wire bonding tool configured to form the wire bonds on the workpiece; and
an ultrasonic transducer system for carrying the wire bonding tool, the ultrasonic transducer system including (a) a transducer mounting structure, (b) a transducer, including at least one mounting flange for coupling the transducer to the transducer mounting structure, and (c) a tuned resonator, the tuned resonator being integrated with at least one of the transducer mounting structure and the at least one mounting flange, the tuned resonator being tuned to an operating frequency of the transducer to provide active vibration absorption and isolation by continuously pushing away structural resonances that would encroach on the operating frequency.

14. A flip chip bonding machine comprising:
a support structure for supporting a workpiece configured to receive a semiconductor element during a flip chip bonding operation;
a bonding tool configured to bond the semiconductor element to a substrate;
and an ultrasonic transducer system for carrying the bonding tool, the ultrasonic transducer system including (a) a transducer mounting structure, (b) a transducer, including at least one mounting flange for coupling the transducer to the transducer mounting structure, and (c) a tuned resonator, the tuned resonator being integrated with at least one of the transducer mounting structure and the at least one mounting flange, the tuned resonator being tuned to an operating frequency of the transducer to provide active vibration absorption and isolation by continuously pushing away structural resonances that would encroach on the operating frequency.

15. A method of providing an ultrasonic transducer system, the method comprising the steps of:
(a) providing a transducer and a transducer mounting structure;
(b) coupling the transducer to the transducer mounting structure using at least one mounting flange of the transducer; and
(c) integrating a tuned resonator with at least one of the transducer mounting structure and the at least one mounting flange, the tuned resonator being tuned to an operating frequency of the transducer to provide active vibration absorption and isolation by continuously pushing away structural resonances that would encroach on the operating frequency.

16. The method of claim 15 wherein step (c) includes integrating the tuned resonator to move a resonant frequency of the transducer mounting structure away from the operating frequency of the transducer.

17. The method of claim 15 wherein step (c) includes coupling the tuned resonator to the transducer mounting structure.

18. The method of claim 15 wherein step (c) includes coupling the tuned resonator to the mounting flange.

19. The method of claim 15 wherein the tuned resonator includes a plurality of tuned resonator elements.

20. The method of claim 15 wherein step (c) includes removing material from the transducer mounting structure.

* * * * *